United States Patent
Choi et al.

(10) Patent No.: US 8,269,417 B2
(45) Date of Patent: Sep. 18, 2012

(54) LIGHT EMITTING DISPLAY AND METHOD OF MANUFACTURING THE SAME

(75) Inventors: Young-seo Choi, Suwon-si (KR);
Seung-yong Song, Suwon-si (KR);
Young-cheol Joo, Suwon-si (KR);
Ji-hun Ryu, Suwon-si (KR); Oh-june Kwon, Suwon-si (KR); Sun-young Jung, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 231 days.

(21) Appl. No.: 12/214,350

(22) Filed: Jun. 16, 2008

(65) Prior Publication Data
US 2009/0066214 A1    Mar. 12, 2009

(30) Foreign Application Priority Data

Sep. 6, 2007  (KR) .......................... 10-2007-0090457

(51) Int. Cl.
*H01L 51/50* (2006.01)
(52) U.S. Cl. ........................... 313/512; 445/25; 257/100
(58) Field of Classification Search .................. 313/512, 313/504, 506; 445/25; 257/100
See application file for complete search history.

(56) References Cited

U.S. PATENT DOCUMENTS

| | | | | |
|---|---|---|---|---|
| 4,094,058 A | * | 6/1978 | Yasutake et al. | 29/592.1 |
| 5,093,712 A | * | 3/1992 | Matsunaga et al. | 257/786 |
| 6,368,730 B1 | * | 4/2002 | Kishimoto et al. | 428/690 |
| 2002/0167269 A1 | * | 11/2002 | Sugimoto et al. | 313/504 |
| 2004/0051452 A1 | * | 3/2004 | Tamashiro et al. | 313/512 |
| 2005/0189877 A1 | * | 9/2005 | Ishida | 313/512 |
| 2006/0125392 A1 | * | 6/2006 | Munekata | 313/512 |
| 2007/0205715 A1 | * | 9/2007 | Saitoh et al. | 313/504 |

FOREIGN PATENT DOCUMENTS

| | | |
|---|---|---|
| JP | 07-169567 | 7/1995 |
| JP | 2001-147423 | 5/2001 |
| JP | 2005-134472 | 5/2005 |
| JP | 2005-134473 | 5/2005 |
| JP | 2007-115496 | 5/2007 |
| KR | 1020040009138 A | 1/2004 |

* cited by examiner

*Primary Examiner* — Nimeshkumar Patel
*Assistant Examiner* — Mary Ellen Bowman
(74) *Attorney, Agent, or Firm* — Knobbe Martens Olson & Bear LLP (57) ABSTRACT

Disclosed are light emitting display and method of manufacturing the same. The light emitting display according to the present embodiments includes a first substrate including a plurality of light emitting devices and a pad portion, all of which are formed therein; a second substrate disposed to face the light emitting devices; and a bonding layer bonded to the light emitting devices and the second substrate, wherein a stepped portion is formed at a predetermined depth in an edge of the second substrate that is adjacent to the pad portion, and the bonding layer is extended to the stepped portion. Since the bonding layer is not bonded to the pad portion due to the depth of the stepped portion when the second substrate is bonded to the first substrate, poor electrical contact may be prevented, and it easy to remove the encapsulation substrate to expose the pad portion. Also, the manufacturing process is simple, the process uniformity is high and the process time is short since the bonding layer is formed in the front of the second substrate.

14 Claims, 8 Drawing Sheets

LIGHT EMITTING DISPLAY AND METHOD OF MANUFACTURING THE SAME

CROSS-REFERENCE TO RELATED APPLICATIONS

This application claims priority to and the benefit of Korean Patent Application No. 10-2007-0090457, filed on Sep. 6, 2007, in the Korean Intellectual Property Office, the entire content of which is incorporated herein by reference.

BACKGROUND OF THE INVENTION

1. Field of the Invention

The present embodiments relate to a light emitting display and a method of manufacturing the same, and more particularly to a light emitting display having a bonding layer provided between a substrate and an encapsulation substrate, the substrate having a light emitting device formed therein, and a method of manufacturing the same.

2. Description of the Related Art

Light emitting devices such as an organic light emitting diode includes organic matter that is vulnerable to moisture or oxygen, and therefore it is necessary to protect such devices from the moisture or oxygen. Accordingly, containers manufactured in the form of a can or a cup made of metal materials, or encapsulation substrates made of glass or plastic are disposed to face a substrate having a light emitting device formed therein, and sealed with a sealant such as epoxy to prevent penetration of moisture or oxygen. However, the structure of the light emitting display has problems in that it is vulnerable to internal pressure due to the presence of void space between the substrate and the encapsulation substrate. A sealed region may be easily broken by the impact due to the low structural reliability. Also, the manufacturing process is complicated.

SUMMARY OF THE INVENTION

Accordingly, the present embodiments solve such drawbacks of the prior art, and therefore an object of the present embodiments is to provide a light emitting display having a high structural reliability, and a method of manufacturing the same.

Another object of the present embodiments is to provide a light emitting display capable of simplifying a manufacturing process, and a method of manufacturing the same.

One embodiment is achieved by providing a light emitting display including a first substrate including a plurality of light emitting devices and a pad portion for supplying signals to the light emitting devices, all of which are formed therein; a second substrate disposed to face the light emitting devices; and a bonding layer bonded to the light emitting devices and the second substrate, wherein a stepped portion is formed in an edge of the second substrate that is adjacent to the pad portion, and the bonding layer is extended to the stepped portion.

Another embodiment is achieved by providing a method of manufacturing a light emitting display including steps of preparing a first substrate including a plurality of light emitting devices and a pad portion for supplying signals to the light emitting devices, all of which are formed therein; providing a second substrate having a stepped portion formed in a region corresponding to the pad portion; forming a bonding layer on the second substrate including the stepped portion; disposing the first substrate and the second substrate to face each other; removing the second substrate and the bonding layer for the region corresponding to the pad portion; and heat-treating the first substrate and the second substrate so that the first substrate and the second substrate are bonded by the bonding layer.

Still another embodiment is achieved by providing a method of manufacturing a light emitting display including steps of preparing a first substrate having a plurality of panel regions defined by scribe lines and including a plurality of light emitting devices and pad portions for supplying signals to the light emitting devices, all of which are formed in each of the panel region; providing a second substrate having stepped portions formed in regions corresponding to the pad portions; forming a bonding layer on the second substrate including the stepped portions; disposing the first substrate and the second substrate to face each other; cutting the first substrate along the scribe lines and separating the panel regions by removing the second substrate and the bonding layer for the regions corresponding to the pad portions; and heat-treating the first substrate and the second substrate so that the first substrate and the second substrate are bonded by the bonding layer.

BRIEF DESCRIPTION OF THE DRAWINGS

These and/or other embodiments and features will become apparent and more readily appreciated from the following description of certain exemplary embodiments, taken in conjunction with the accompanying drawings of which.

DETAILED DESCRIPTION OF PREFERRED EMBODIMENTS

In the following detailed description, only certain exemplary embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 1:
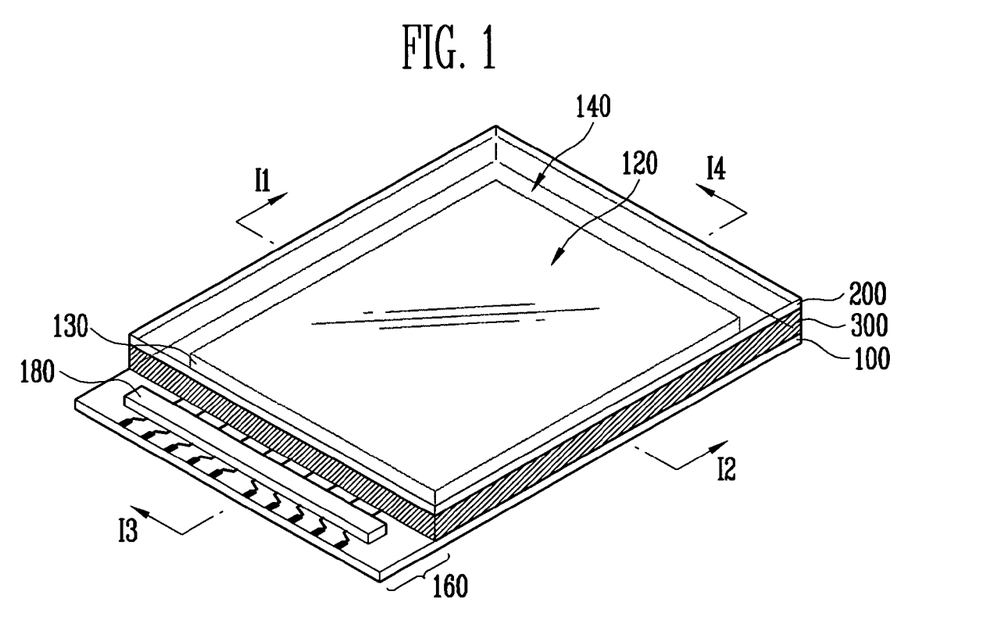
FIG. 1 is a perspective view showing a light emitting display according to the present embodiments.
Figure 2A:
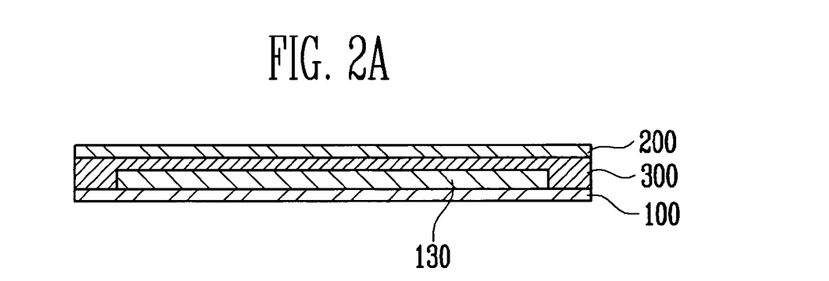
FIG. 2A is a cross-sectional view taken from a line I1-I2 as shown in FIG. 1.
Figure 2B:
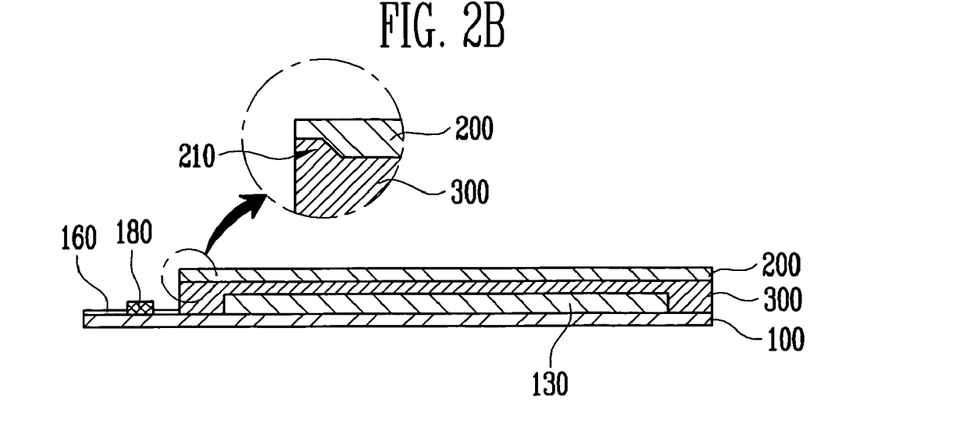
FIG. 2B is a cross-sectional view taken from a line I3-I4 as shown in FIG. 1.

FIG. 1 is a perspective view showing a light emitting display according to the present embodiments, and FIGS. 2A and 2B are cross-sectional views.

The light emitting display according to the present embodiments includes a substrate 100 including a plurality of light emitting devices 130 and a pad portion 160 for supplying signals to a light emitting device 130, all of which are formed therein; an encapsulation substrate 200 disposed to face the light emitting device 130; and a bonding layer 300 bonded to the light emitting device 130 and the encapsulation substrate 200.

The substrate 100 is composed of a pixel region 120 and a non-pixel region 140 surrounding the pixel region 120. The light emitting device 130 is formed in the pixel region 120 of the substrate 100, and may be composed of organic light emitting diodes including an anode electrode, an organic thin film layer and a cathode electrode. And, the pad portion 160 is formed in the non-pixel region 140 of the substrate 100, and may include a bonding pad to which a plurality of input pads and a drive circuit 180 are attached, a plurality of the input pads functioning to input signals from the outside. The drive circuit 180 processes the signals inputted through the input pad to generate signals for driving a light emitting device 130.

The encapsulation substrate 200 has a size such that it can be overlapped with some of the pixel region 120 and the non-pixel region 140, and a predetermined depth of the stepped portion 210 is formed in an edge adjacent to the pad portion 160.

The bonding layer 300 is formed in the front of the encapsulation substrate 200 including the stepped portion 210. The bonding layer 300 may be formed by attaching to the front of the encapsulation substrate 200 a solid film that has a high transmittance and adhesive properties on both sides or formed by coating the entire surface of the encapsulation substrate 200 with a liquid material having a high viscosity and softening the encapsulation substrate 200 (heat treatment or irradiation of ultraviolet rays). When the substrate 100 and the encapsulation substrate 200 are disposed to face each other, the light emitting device 130 is sealed by bonding the encapsulation substrate 200 to the substrate 100 through the bonding layer 300. In this case, the bonding layer 300 preferably includes an absorbent to prevent penetration of moisture or oxygen into the light emitting device 130.

The present embodiments will now be described in more detail with reference to the method of manufacturing a light emitting display according to the present embodiments.

Figure 3A:
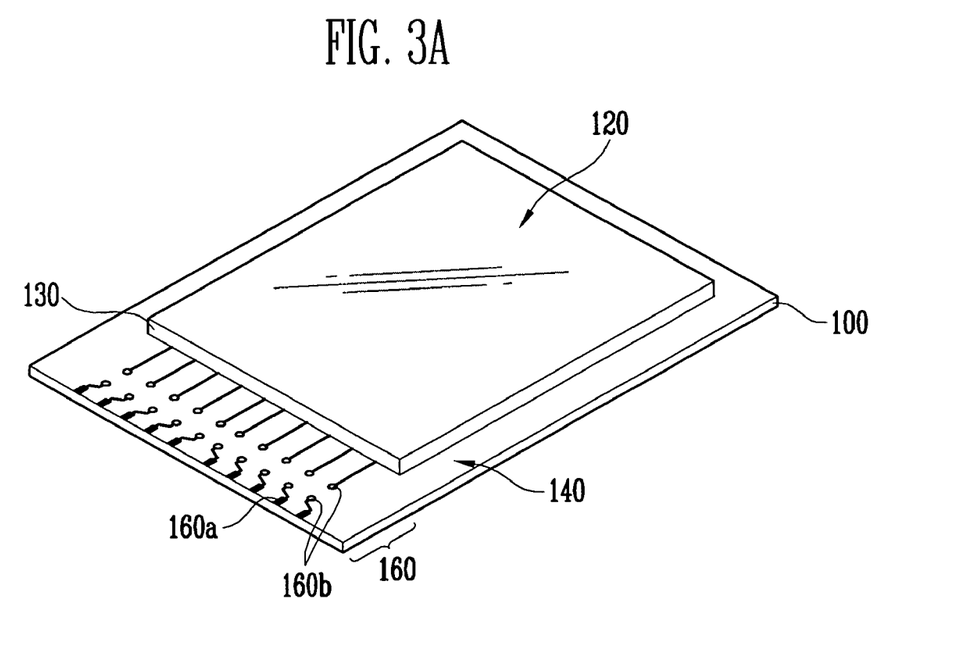
FIGS. 3A and 3F are perspective views showing a method for manufacturing a light emitting display according to one exemplary embodiment.
Figure 3B:
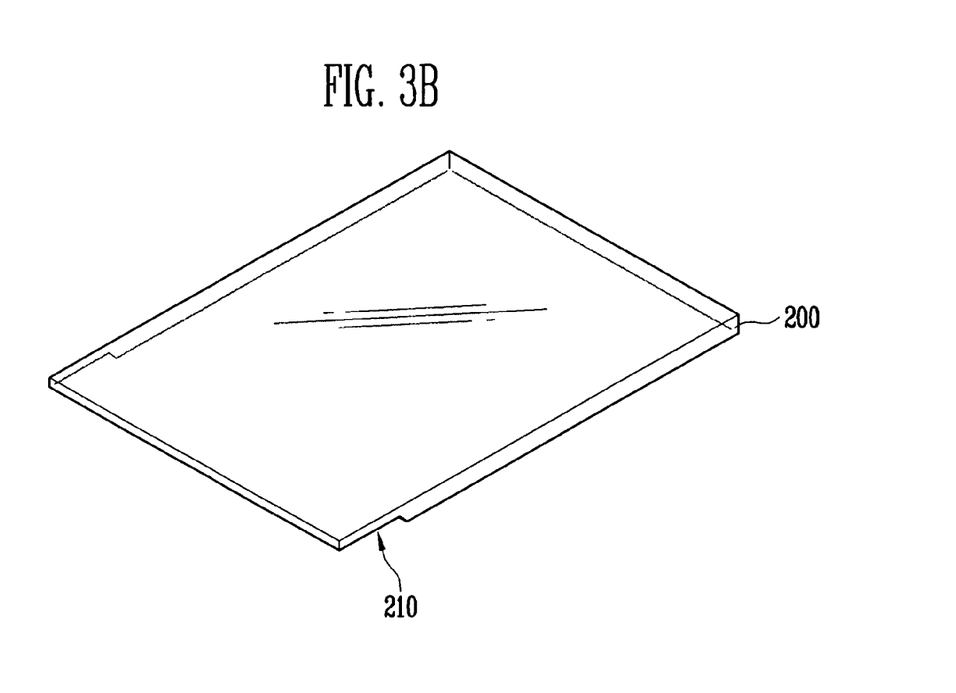
Figure 3C:
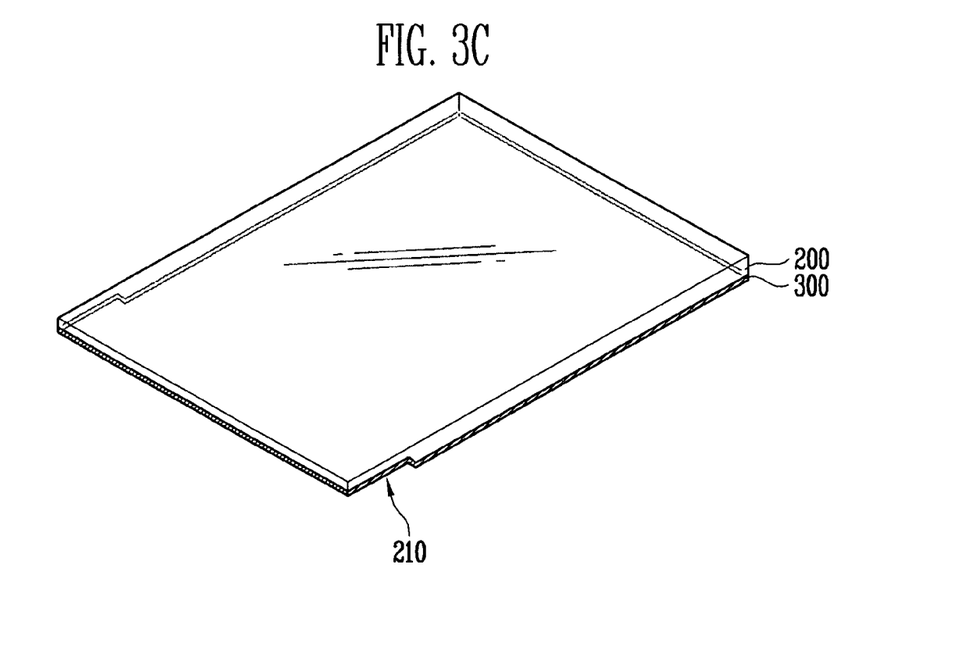
Figure 3D:
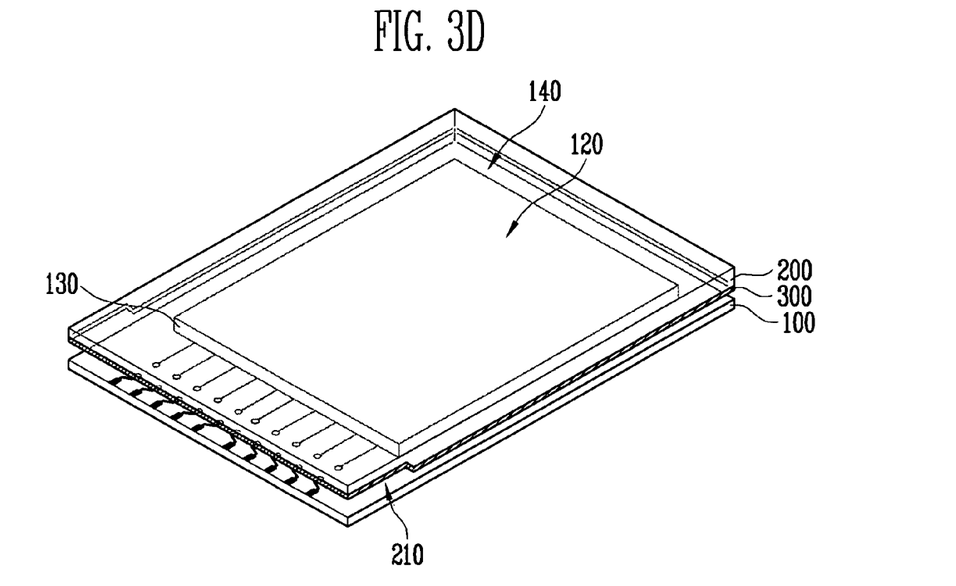
Figure 3E:
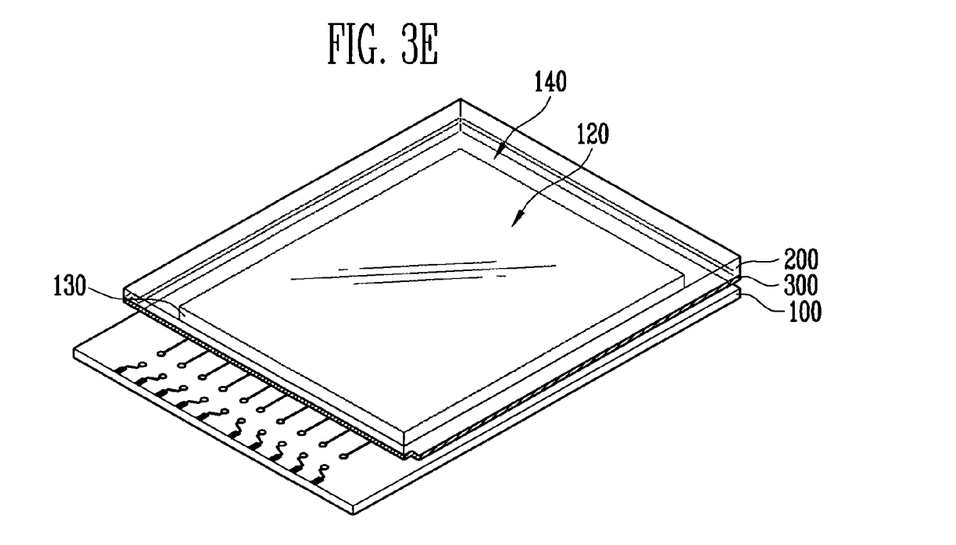
Figure 3F:
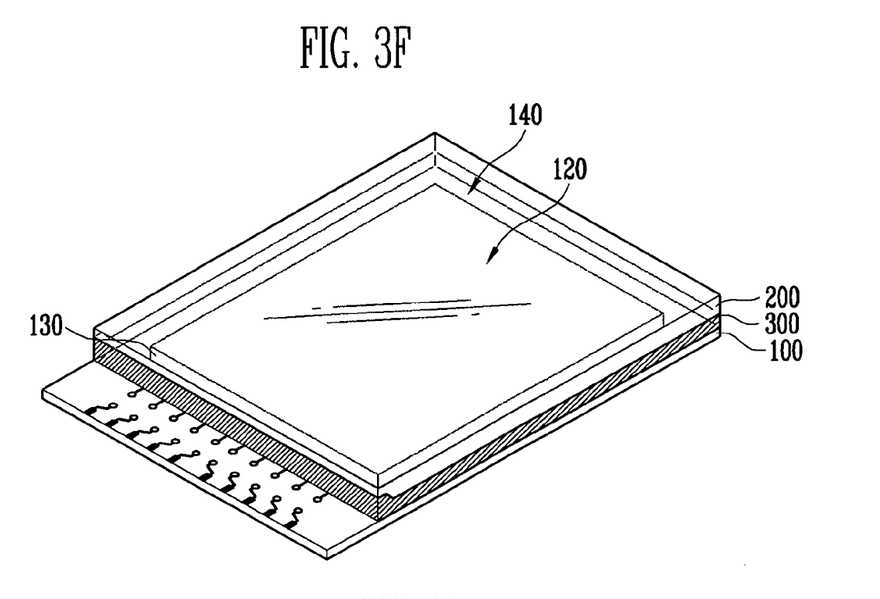

FIGS. 3A and 3F are perspective views showing a method for manufacturing a light emitting display according to one exemplary embodiment.

Referring to FIG. 3A, first, a substrate 100 is prepared, the substrate 100 including a plurality of light emitting devices 130 and a pad portion 160 for supplying a signal to the light emitting devices 130, all of which are formed therein.

The light emitting device 130 is formed in a pixel region 120 of the substrate 100. The light emitting device 130 may be composed of organic light emitting diodes including an anode electrode, an organic thin film layer and a cathode electrode, and further include a thin film transistor for controlling operation of the light emitting device 130; and a capacitor for maintaining a signal. See US Patent Publication No. 2005/0104514 (published on May 19, 2005) and Korean Patent Publication No. 2003-0092873 (published on Dec. 6, 2003) (both of which are herein incorporated by reference in their entirety) for the method for manufacturing an organic light emitting diode.

The pad portion 160 may include a plurality of input pads 160a formed in the non-pixel region 140 of the substrate 100 and inputting a signal from the outside; and a bonding pad 160b to which a drive circuit is attached.

Referring to FIG. 3B, an encapsulation substrate 200 having the stepped portion 210 formed in a region corresponding to the pad portion 160 is prepared. The encapsulation substrate 200 is to encapsulate the light emitting device 130 of the pixel region 120, and has a size so that it can be overlapped with some of the pixel region 120 and the non-pixel region 140. For the top emissions structure, a transparent substrate such as glass, for example, may be used as the encapsulation substrate 200, or for the bottom emissions structure, an opaque substrate may be used as the encapsulation substrate 200.

The stepped portion 210 of the encapsulation substrate 200 may be formed using various methods such as etching, sand blasting, molding, etc. In some embodiments, the stepped portion 210 is formed at a higher depth than the bonding layer 300, and preferably at a higher depth as much as 2 times or more than the bonding layer 300.

Referring to FIG. 3C, a bonding layer 300 having a thickness of from about 10 µm to about 1.0 mm is, for example, formed in the front of the encapsulation substrate 200 including the stepped portion 210. The bonding layer 300 in the region corresponding to the pad portion 160 is disposed due to the presence of the stepped portion 210 in a position that is lower than the other region.

The bonding layer 300 is formed in the front of the encapsulation substrate 200 including the stepped portion 210. The bonding layer 300 may be formed by attaching to the front of the encapsulation substrate 200 a solid film that has a high transmittance and which both sides have adhesive property, or formed by coating the entire surface of the encapsulation substrate 200 with a liquid material having a high viscosity and softening the encapsulation substrate 200 (heat treatment or irradiation of ultraviolet rays). Materials of the solid film may be at least one selected from the group consisting of silicon oxides (SiOx), calcium oxide (CaO), calcium hydroxide ($Ca(OH)_2$), silicon nitride (SiN), silicon acid nitride (SiON), acryl resin, epoxy resin, fluorine resin and TEFLON® (Dupont, Wilmington, Del.) resin, and the liquid material may be one selected from the group consisting of acryl resin, epoxy resin, fluorine resin and TEFLON® resin. Also, the bonding layer 300 preferably includes an absorbent to prevent penetration of moisture or oxygen into the light emitting device 130.

Referring to FIG. 3D, the substrate 100 and the encapsulation substrate 200 are disposed to face each other, and then bonded to each other. When the substrate 100 and the encapsulation substrate 200 are bonded to each other, the light emitting device 130 of the pixel region 120 is bonded to the bonding layer 300, but the substrate 100 of the non-pixel region 140 and the pad portion 160 are not in contact to the bonding layer 300. In particular, a distance as much as the depth of the stepped portion 210 is formed between the pad portion 160 and the bonding layer 300.

Referring to FIG. 3E, the encapsulation substrate 200 and the bonding layer 300 are removed from the region corresponding to the pad portion 160. The encapsulation substrate 200 may be cut so that some of the stepped portion 210 can remain in the edge of the encapsulation substrate 200 adjacent to the pad portion 160. In this case, end points of the encapsulation substrate 200 of the stepped portion 210 and the bonding layer 300 accords with each other within the range of several hundred µm.

Referring to FIG. 3F, the substrate 100 and the encapsulation substrate 200 are heat-treated so that the substrate 100 and the encapsulation substrate 200 can be bonded to each other by the bonding layer 300. As the bonding layer 300 melts and flows by the high-temperature treatment, a space between the substrate 100 and the encapsulation substrate 200 of the non-pixel region 140 is filled with the bonding layer 300, and the substrate 100 and the encapsulation substrate 200 are bonded to each other at the same time.

If the bonding layer 300 is formed in the encapsulation substrate 200 where the stepped portion 210 is not formed and the substrate 100 and the encapsulation substrate 200 are bonded to each other, the bonding layer 300 is bonded even to the pad portion 160, which leads to the poor electrical contact and the difficulty in removing the encapsulation substrate 200. To solve the above problems, a bonding layer produced in the form of film is patterned and bonded selectively. However, the uniform process is difficult due to the difference in physical properties such as dimensional tolerance and tensile force according to the thickness of the film, and the process time is increased. According to the present embodiments, if the stepped portion 210 is formed in the encapsulation substrate 200 of the region corresponding to the pad portion 160, the bonding layer 300 is not in direct contact with the pad portion 160 when the substrate 100 and the encapsulation substrate 200 are bonded to each other. Therefore, poor electrical contact is prevented, and it is also easy to remove the encapsulation substrate 200 to expose the pad portion.

FIGS. 4A to 4F are perspective views showing a method for manufacturing a light emitting display according to another exemplary embodiment. Here, the manufacturing method where a plurality of display panels is manufactured on one substrate by mother unit will be described in detail.

Figure 4A:
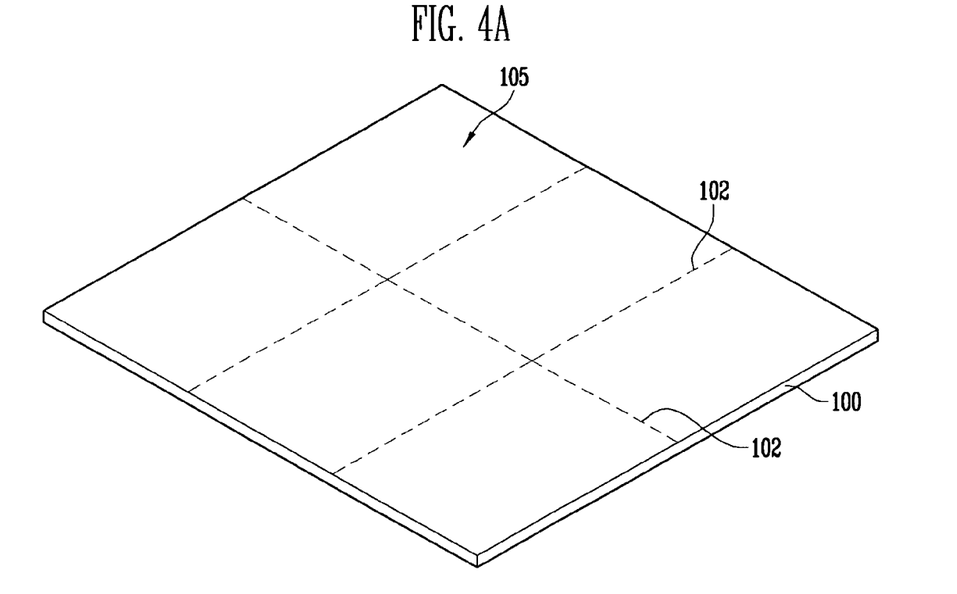
FIGS. 4A to 4F are perspective views showing a method for manufacturing a light emitting display according to another exemplary embodiment.

Referring to FIG. 4A, a mother substrate 100 in which a plurality of panel regions 105 are defined by crossed scribe lines 102 is prepared.

Figure 4B:
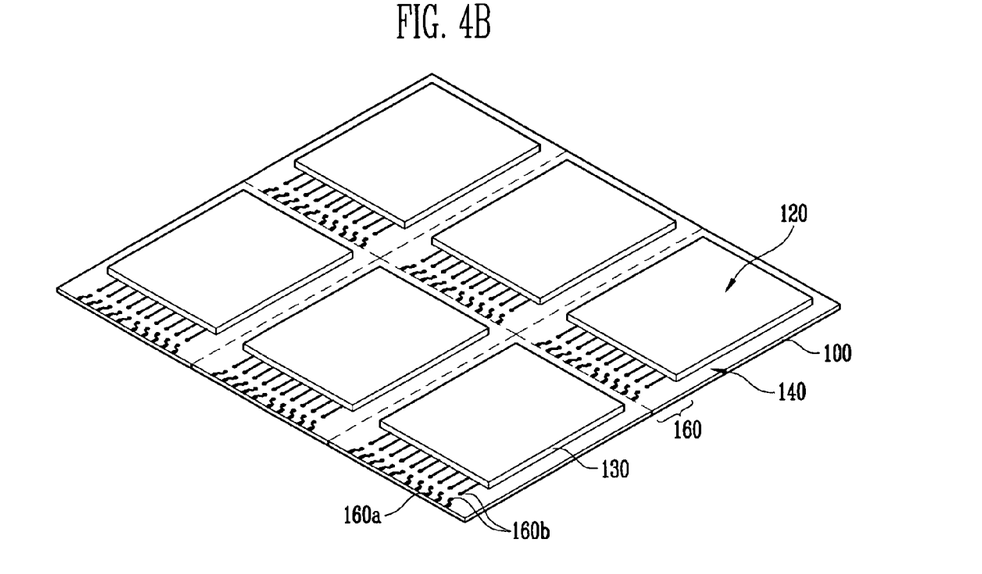

Referring to FIG. 4B, a plurality of light emitting devices 130 and a pad portion 160 for supplying signals to a plurality of the light emitting devices 130 are formed on each of the panel regions 105, as shown in FIG. 3A.

The light emitting device 130 is formed in the pixel region 120 of the substrate 100. The light emitting device 130 may be composed of organic light emitting diodes including an anode electrode, an organic thin film layer and a cathode electrode, and further include a thin film transistor for controlling operation of the light emitting device 130 and a capacitor for maintaining a signal.

The pad portion 160 is formed in the non-pixel region 140 of the substrate 100, and may include a plurality of input pads 160a for inputting signals from the outside and a bonding pad 160b to which a drive circuit is attached.

Figure 4C:
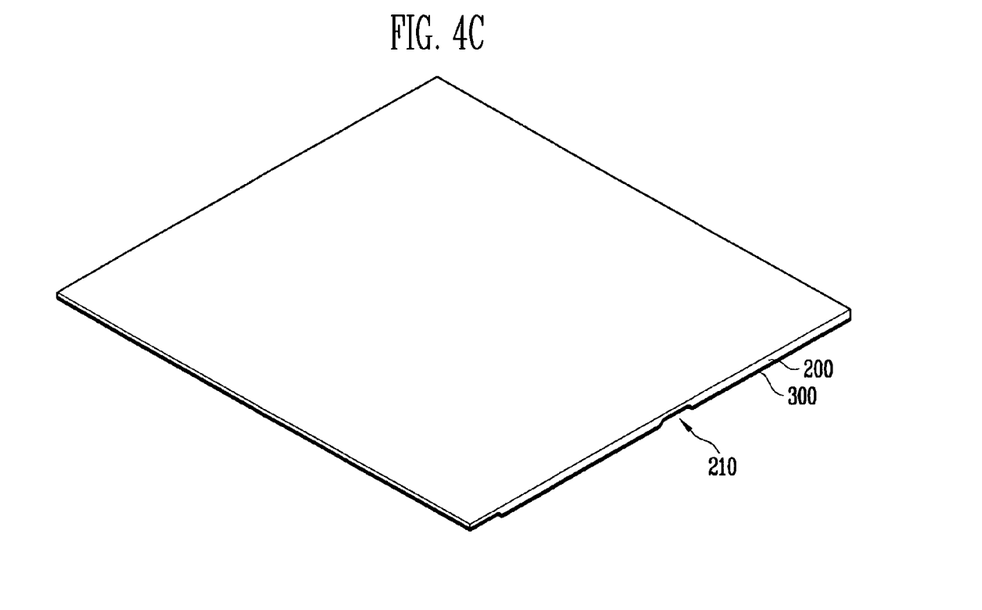

Referring to FIG. 4C, an encapsulation substrate 200 is prepared, the encapsulation substrate 200 having a predetermined depth of the stepped portions 210 formed in regions corresponding to the pad portions 160 of the substrate 100. The encapsulation substrate 200 may have the same size as the mother substrate 100, and the stepped portion 210 may be formed using various methods such as, for example, etching, sand blasting, molding, etc. In this case, the stepped portion 210 is formed at a higher depth than the bonding layer 300, and preferably at a higher depth as much as 2 times or more than the bonding layer 300. The stepped portion 210 may be also formed at a long length in the form of trench where the stepped portion 210 is coupled to the stepped portion 210 of the adjacent panel region 105.

Then, a bonding layer 300 is formed in the front of the encapsulation substrate 200 including the stepped portions 210. The bonding layer 300 may be formed by attaching to the front of the encapsulation substrate 200 a solid film that has a high transmittance and whose both sides have adhesive property, or formed by coating the entire surface of the encapsulation substrate 200 with a liquid material having a high viscosity and softening the encapsulation substrate 200 (heat treatment or irradiation of ultraviolet rays).

Figure 4D:
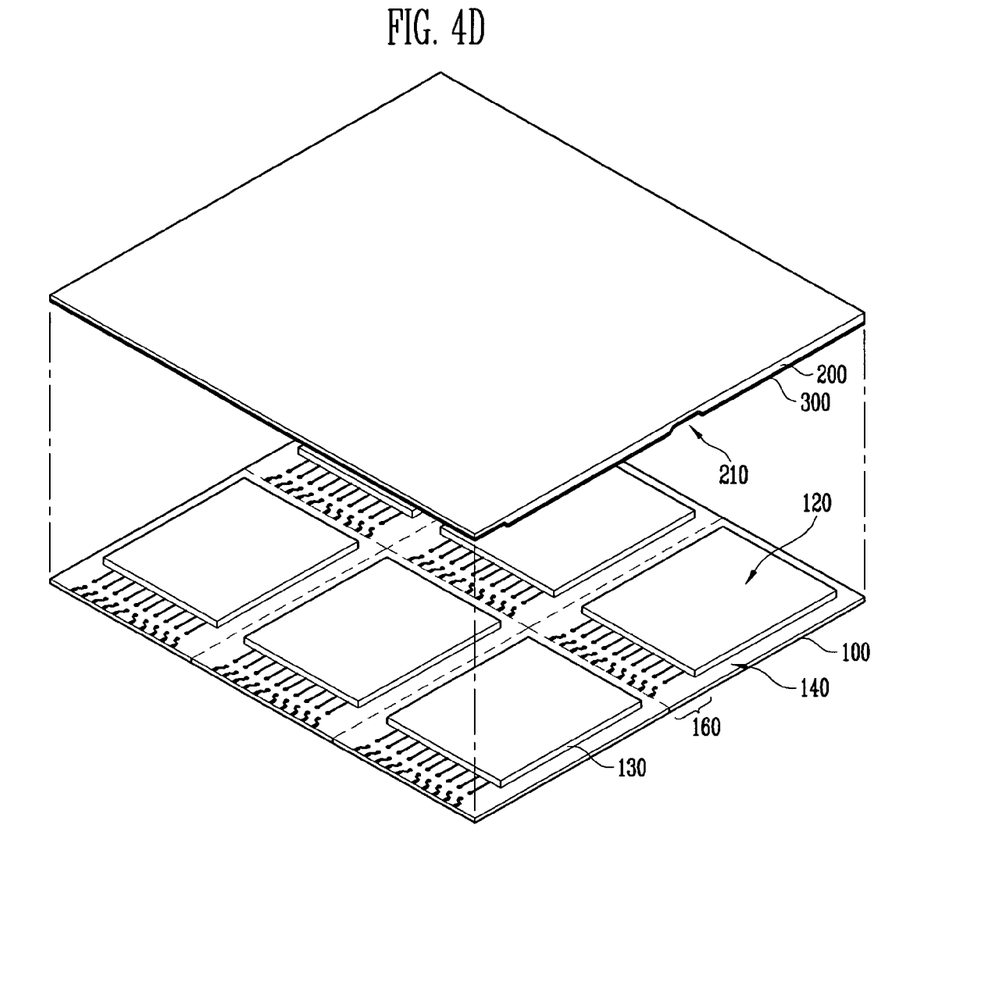

Referring to FIG. 4D, the mother substrate 100 and the encapsulation substrate 200 are disposed to face each other, and then bonded to each other. When the substrate 100 and the encapsulation substrate 200 are bonded to each other, the light emitting device 130 of the pixel region 120 is bonded to the bonding layer 300, but the substrate 100 of the non-pixel region 140 and the pad portion 160 are not in contact to the bonding layer 300. In particular, a distance as much as the depth of the stepped portion 210 is formed between the pad portion 160 and the bonding layer 300.

Figure 4E:
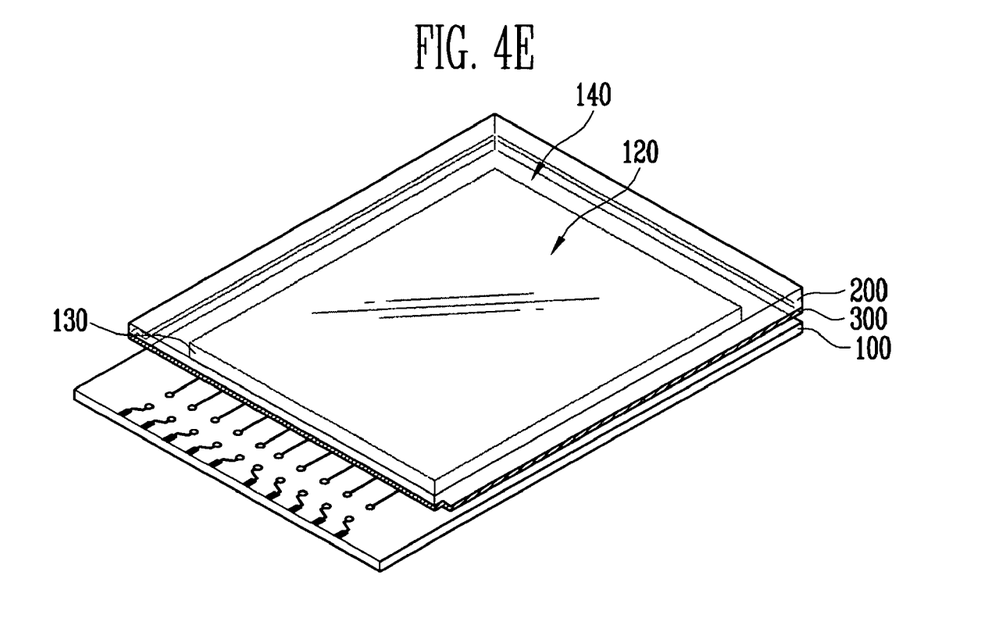

Referring to FIG. 4E, the substrate 100 is cut along the scribe lines 102, and the encapsulation substrate 200 and the bonding layer 300 are removed from the region corresponding to the pad portion 160, thereby separating each of the panel regions 105. The substrate 100 may be cut so that some of the stepped portion 210 can remain in the edge of the encapsulation substrate 200 adjacent to the pad portion 160. In this case, end points of the encapsulation substrate 200 of the stepped portion 210 and the bonding layer 300 accords with each other within the range of several hundred μm.

Figure 4F:
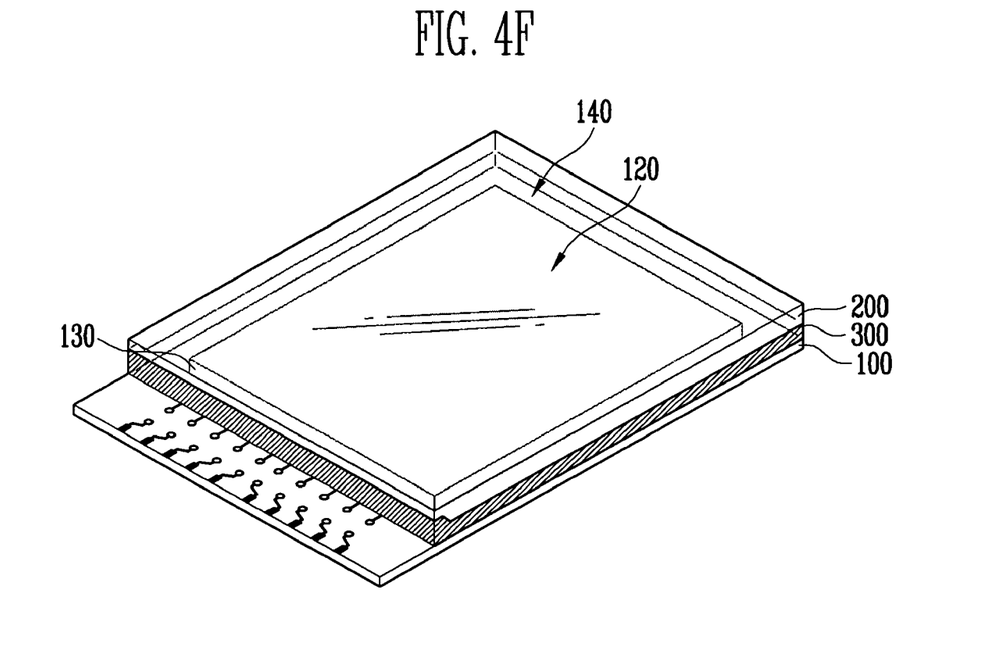

Referring to FIG. 4F, the substrate 100 and the encapsulation substrate 200 are heat-treated so that the substrate 100 and the encapsulation substrate 200 can be bonded to each other by the bonding layer 300. As the bonding layer 300 melts and flows by the high temperature treatment, a space between the substrate 100 and the encapsulation substrate 200 of the non-pixel region 140 is filled with the bonding layer 300, and the substrate 100 and the encapsulation substrate 200 are bonded to each other at the same time.

According to the exemplary embodiment, the drive circuit 180 may be formed on the substrate 100 of the non-pixel region 140 in the process of manufacturing the light emitting device 130, or the drive circuit may be manufactured into separate integrated circuit semiconductor chips, and then attached to the bonding pad 160 using a chip on glass process or a wire bonding process.

As described above, according to the present embodiments, the stepped portion is formed in the encapsulation substrate of the region corresponding to the pad portion, and the bonding layer is formed in the front of the encapsulation substrate including the stepped portion. Therefore, the poor electrical contact may be prevented and it is also easy to remove the encapsulation substrate to expose the pad portion since the bonding layer is not in contact with the pad portion due to the presence of the depth of the stepped portion when the substrate and the encapsulation substrate are bonded to each other.

The light emitting display according to the exemplary embodiment has advantages that the manufacturing process is simple, the process uniformity is high, and the process time is short since a bonding layer is formed in the front of the encapsulation substrate. Also, the internal pressure and structural reliability are improved since the light emitting device is protected from the penetration of moisture or oxygen due to the presence of the bonding layer and a space between the substrate and the encapsulation substrate is filled with the bonding layer.

Although exemplary embodiments have been shown and described, it would be appreciated by those skilled in the art that changes might be made in these embodiments without departing from the principles and spirit of the present embodiments, the scope of which is defined in the claims and their equivalents.

What is claimed is:
1. A light emitting display, comprising:
a first substrate including a plurality of light emitting devices formed in a pad portion configured to supply signals to the light emitting devices;

a second substrate disposed to face the light emitting devices; and a bonding layer bonded to the light emitting devices and the second substrate, wherein a stepped portion is formed in an edge of the second substrate that is adjacent to the pad portion, and wherein the bonding layer is extended to the stepped portion;

wherein the bonding layer is composed of solid film both sides of which have adhesive property; and wherein the solid film is calcium hydroxide ($Ca(OH)_2$).

2. The light emitting display according to claim 1, wherein the first substrate and the second substrate are bonded by the bonding layer.

3. The light emitting display according to claim 1, wherein the bonding layer is coated with a liquid material and softened.

4. The light emitting display according to claim 1, wherein the stepped portion has a higher depth than the thickness of the bonding layer.

5. The light emitting display according to claim 1, wherein an end point of the second substrate in the stepped portion accords with an end point of the bonding layer.

6. A method of manufacturing a light emitting display, the method comprising:

preparing a first substrate including a plurality of light emitting devices formed in a pad portion configured to supply signals to the light emitting devices;

providing a second substrate having a stepped portion formed in a region corresponding to the pad portion;

forming a bonding layer on the second substrate including the stepped portion;

disposing the first substrate and the second substrate to face each other;

removing the second substrate and the bonding layer for the region corresponding to the pad portion; and heat-treating the first substrate and the second substrate so that the first substrate and the second substrate are bonded by the bonding layer;

wherein the bonding layer is composed of solid film both sides of which have adhesive property; and wherein the solid film is calcium hydroxide ($Ca(OH)_2$).

7. The method of manufacturing a light emitting display according to claim 6, wherein the bonding layer is coated with a liquid material and softened.

8. The method of manufacturing a light emitting display according to claim 6, wherein the stepped portion is formed with a higher depth than the thickness of the bonding layer.

9. The method of manufacturing a light emitting display according to claim 6, wherein the heat treatment is carried out so that the bonding layer flows to bond the second substrate to the first substrate.

10. A method of manufacturing a light emitting display, the method comprising:

preparing a first substrate having a plurality of panel regions defined by scribe lines and including a plurality of light emitting devices formed in pad portions configured to supply signals to the light emitting devices;

providing a second substrate having stepped portions formed in regions corresponding to the pad portions;

forming a bonding layer on the second substrate including the stepped portions;

disposing the first substrate and the second substrate to face each other;

cutting the first substrate along the scribe lines and separating the panel regions by removing the second substrate and the bonding layer for the regions corresponding to the pad portions; and heat-treating the first substrate and the second substrate so that the first substrate and the second substrate are bonded by the bonding layer;

wherein the bonding layer is composed of solid film both sides of which have adhesive property; and wherein the solid film is calcium hydroxide ($Ca(OH)_2$).

11. The method of manufacturing a light emitting display according to claim 10, wherein the bonding layer is coated with a liquid material and softened.

12. The method of manufacturing a light emitting display according to claim 10, wherein the stepped portions are formed with a higher depth than a thickness of the bonding layer.

13. The method of manufacturing a light emitting display according to claim 10, wherein the heat treatment is carried out so that the bonding layer flows to bond the second substrate to the first substrate.

14. The method of manufacturing a light emitting display according to claim 10, wherein the stepped portions are formed with a trench shape.

* * * * *

(12) SUPPLEMENTAL EXAMINATION CERTIFICATE

| United States Patent | (10) Number: | 8,269,417 F1 |
|---|---|---|
| Choi et al. | (45) Certificate Issued: | Sept. 30, 2015 |

Control No.: 96/000,112  Filing Date: Jul. 6, 2015
Primary Examiner: Henry Tran

No substantial new question of patentability is raised in the request for supplemental examination. See the Reasons for Substantial New Question of Patentability Determination in the file of this proceeding.

(56) Items of Information

U.S. PATENT DOCUMENTS

2005/0104514 A1     5/2005          KIM et al.

FOREIGN PATENT DOCUMENTS

KR          10-2003-0092873 A    12/2003